United States Patent [19]
Salmon

[11] Patent Number: 5,533,196
[45] Date of Patent: Jul. 2, 1996

[54] METHOD AND APPARATUS FOR TESTING FOR A SUFFICIENT WRITE VOLTAGE LEVEL DURING POWER UP OF A SRAM ARRAY

[75] Inventor: Joseph H. Salmon, Placerville, Calif.

[73] Assignee: Intel Corporation, Santa Clara, Calif.

[21] Appl. No.: 189,307

[22] Filed: Jan. 31, 1994

[51] Int. Cl.⁶ .................................................. G06F 11/34
[52] U.S. Cl. .................................. 395/185.07; 371/21.1; 365/201
[58] Field of Search ................................... 395/575, 425, 395/185.07; 371/21.1, 21.2, 22.1, 28; 365/205, 201

[56] References Cited

U.S. PATENT DOCUMENTS

| | | | |
|---|---|---|---|
| 4,553,225 | 11/1985 | Ohe | 365/201 |
| 4,744,061 | 5/1988 | Takemae et al. | 365/201 |
| 4,916,700 | 4/1990 | Ito et al. | 371/21.1 |
| 5,185,722 | 2/1993 | Ota et al. | 365/201 |
| 5,341,382 | 8/1994 | Levitt | 371/22.1 |

*Primary Examiner*—Robert W. Beausoliel, Jr.
*Assistant Examiner*—Phung My Chung
*Attorney, Agent, or Firm*—Blakely, Sokoloff, Taylor & Zafman

[57] ABSTRACT

A SRAM testing circuit utilized to assure that a voltage is at a sufficient level for accessing a memory cell including a pair of memory cells each including those elements necessary to duplicate the memory cells of an associated memory array, a circuit for providing alternating-valued input signals for writing to the pair of memory cells during each clock period at which a write operation may occur, apparatus for emulating the load provided to a bitline of an associated memory array, apparatus for applying the input signals to one of the pair of memory cells and applying the inverse of the input signals to the other of the pair of memory cells, apparatus for testing both the condition of each of the memory cells after the application of the input and inverse input signals against the condition of the signals provided to each of the cells to determine if each of the pair of memory cells has switched to the appropriate condition, and apparatus for generating a fail signal if either one of the pair of memory cells has not switched to the appropriate condition.

20 Claims, 2 Drawing Sheets

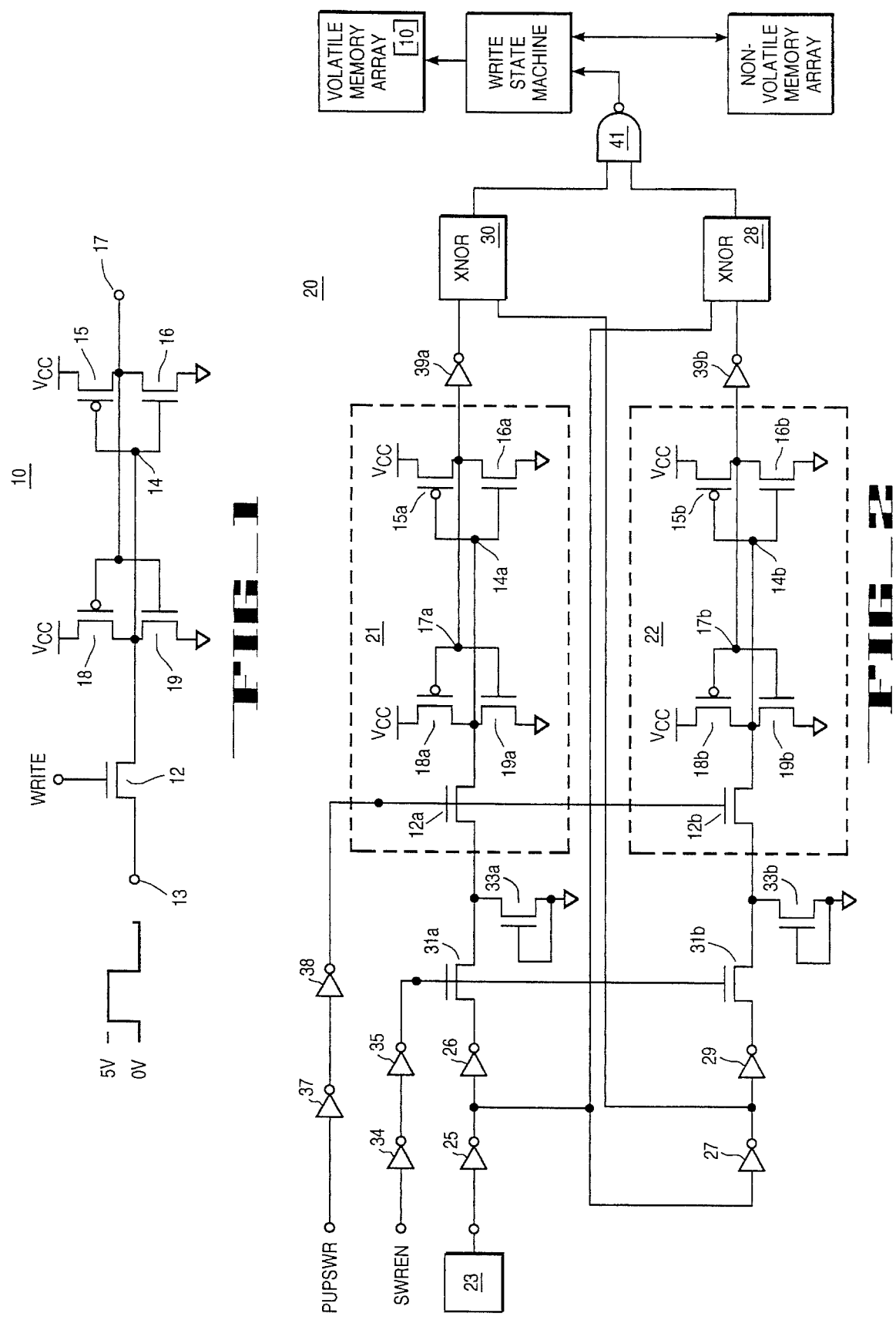

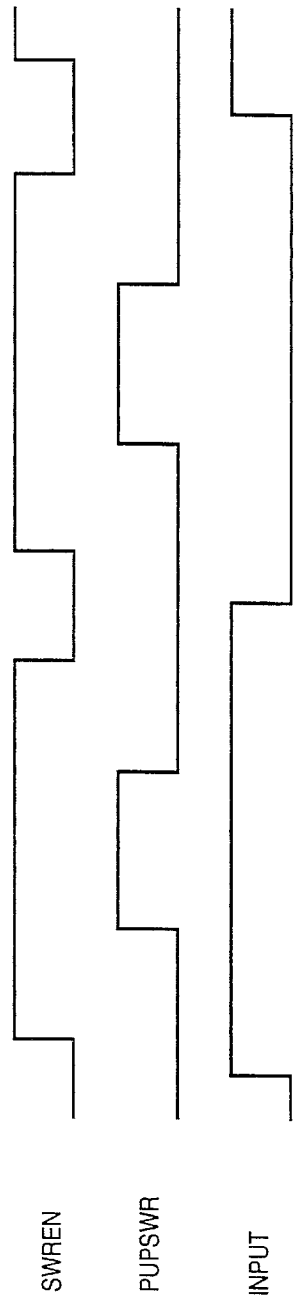
FIG_3
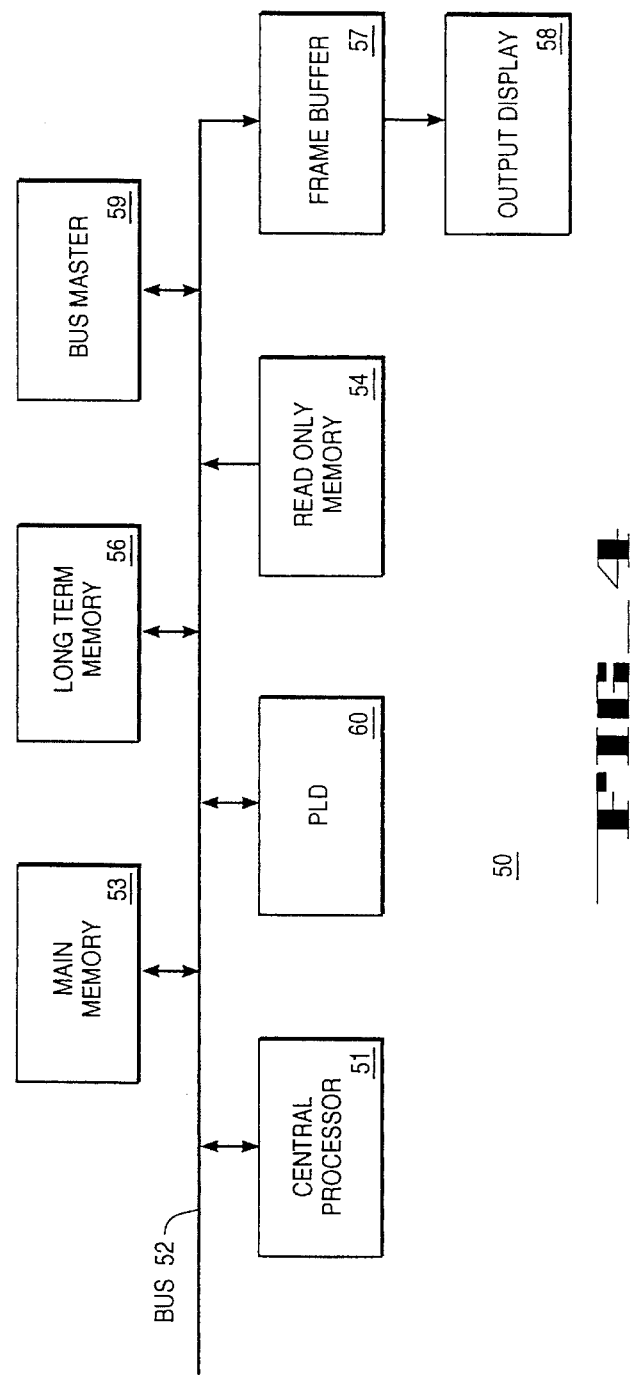
FIG_4

METHOD AND APPARATUS FOR TESTING FOR A SUFFICIENT WRITE VOLTAGE LEVEL DURING POWER UP OF A SRAM ARRAY

BACKGROUND OF THE INVENTION

1. Field of the Invention

This invention relates to computer systems, and more particularly, to an apparatus and a method for testing to determine that a system has a sufficient voltage level to write to static random access memory (SRAM) during the entire period of the write operation.

2. History of the Prior Art

There are situations in which it is desirable to transfer data stored in a non-volatile memory such as an EPROM to volatile memory. For example, when a computer system is initially turned on, the basic input/output startup (BIOS) program typically stored in non-volatile memory in Intel based computers may be transferred to main memory so that its operations become available more rapidly to the central processing unit.

In some arrangements in which data stored in a non-volatile memory is transferred to volatile memory, the volatile memory is a static random access memory (SRAM) array. It is necessary before such a SRAM array is loaded to make sure that sufficient voltage levels are available to assure that data may be written accurately to the SRAM cells. This same requirement may occur when writing to other memory devices, as well. This is a particular problem when a computer is first being turned on because the operating conditions have often not yet stabilized and great demands are being placed on its power supply. To assure that sufficient voltage is available to write to the SRAM cells of the SRAM array, a voltage detector circuit is typically utilized. This voltage detector allows the SRAM cells to be written only after the power supply voltage Vcc has reached an appropriate level. Once the detector is satisfied, writing may take place at any time. In many circuits, such a voltage level detector is all that is required. However, in computers and similar systems which operate at lower levels of power or which for other reasons are able to furnish only limited voltages, the margin for error in the power supply voltage may be sufficiently small that variations in the voltage actually available, the temperature of the circuit, and other characteristics often reduce the voltage level below that level which was initially available, often to a point at which the SRAM cells are in fact not able to be accurately written.

It is therefore desirable to provide circuitry for accurately testing the amount of power supply voltage available during the entire period in which a volatile memory array is being written from a non-volatile storage in order to assure that the data is written accurately.

SUMMARY OF THE INVENTION

It is, therefore, an object of the present invention to provide circuitry for accurately testing the power supply voltage available during the entire period in which a volatile memory array is being written from non-volatile storage in order to assure that the data is written accurately.

It is another, more specific, object of the present invention to provide circuitry which assures that at the instant a write operation is to occur, sufficient power supply voltage is available to accurately write the data.

These and other objects of the present invention are realized in a SRAM testing circuit comprising a pair of memory cells each including those elements necessary to duplicate the memory cells of an associated memory array, a circuit for providing alternating valued input signals for writing to the pair of memory cells during each clock period at which a write operation may occur, means for emulating the load provided to a bitline of an associated memory array, means for applying the input signal to one of the pair of memory cells and applying the inverse of the input signal to the other of the pair of memory cells, means for testing the condition of each of the memory cells after the application of the input and inverse input signals against the condition of the signal provided to each of the cells to determine if each of the pair of memory cells has switched to the appropriate condition, and means for generating a fail signal if either one of the pair of memory cells has not switched to the appropriate condition.

These and other objects and features of the invention will be better understood by reference to the detailed description which follows taken together with the drawings in which like elements are referred to by like designations throughout the several views.

BRIEF DESCRIPTION OF THE DRAWINGS

FIG. 1 is a circuit diagram of an SRAM memory cells which may be used in a memory array to store a condition held in a non-volatile memory cells during an off condition of a system utilizing the memory array.

FIG. 2 is a partially-circuit/partially-block diagram of a one chip implementation of circuitry including a non-volatile memory, a volatile memory, and a circuit designed in accordance with the present invention to assure that sufficient power supply voltage is available to operate memory cells of the volatile memory such as those illustrated in FIG. 1.

FIG. 3 is a series of timing diagrams which illustrate the condition of signals utilized in the present invention.

FIG. 4 is block diagram illustrating a computer system which may be combined with the circuit of FIG. 2 in accordance with the present invention.

NOTATION AND NOMENCLATURE

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to a method and apparatus for operating a computer in processing electrical or other (e.g. mechanical, chemical) physical signals to generate other desired physical signals.

DETAILED DESCRIPTION

Referring now to FIG. 1, there is illustrated a SRAM memory cell 10 designed to store one of two binary conditions which will be referred to herein as high (one) or low (zero). The cell 10 may be used in accordance with the present invention to store a binary condition which is typically retained in some form of non-volatile memory during a period in which a computer system or some similar electronic system using the cell 10 is in the off condition. For example, it is typical for data to be stored in an EPROM while a computer is off, then to be read from that array to faster SRAM memory once the computer is started. In most cases, the EPROM memory array and the SRAM memory are designed as parts of separate circuits. However, a much more effective solution provides a single integrated circuit chip which includes both the non-volatile and the volatile memory arrays as well as the circuitry described herein, wherein sufficient power supply voltage is guaranteed to operate the memory cells of the volatile memory during the initial application of power to the circuitry. Such an arrangement may find use as a programmable logic circuit which is used to control the association of various peripheral devices with the system bus of a computer system. Such a programmable logic circuit may include an array of volatile memory cells which are initialized to provide the various logic functions desired to be performed. These volatile memory cells may be written with data stored in non-volatile memory when power is first applied to a computer system.

The cell 10 includes an N type field effect transistor (FET) device 12 through which an input signal level is applied for writing to the cell 10. Typically, a write control signal is applied to the gate of the device 12 so that the voltage at a terminal 13 is applied to the cell 10. Depending on the particular condition to be stored in the cell 10, the input voltage level furnished at the terminal 13 from the non-volatile cell will be either high (e.g., 5 v.) or low (ground). The voltage furnished to the cell 10 less the switching voltage Vt of the device 12 is applied at a node 14. The node 14 joins to the gate terminals of a pair of FET devices 15 and 16. The device 15 is a P type device and has its source terminal joined to a power supply voltage Vcc which may be 5 volts. The drain terminal of the device 15 is connected to the drain terminal of the N type FET 16 which has its source terminal joined to ground. The particular values of the devices 15 and 16 are chosen so that a high voltage level furnished by the device 12 turns on the device 16 and applies ground to an output terminal 17. A low voltage furnished by the device 12 turns on the device 15 and applies Vcc to the output terminal 17. The value at the output terminal 17 is fed back to the gate terminals of a second pair of FET devices 18 and 19. The device 18 is a P type device and has its source terminal joined to the power supply voltage Vcc. The drain terminal of the device 18 is connected to the drain terminal of the N type FET 19 which has its source terminal joined to ground.

The output voltage at the terminal 17, if low, turns on the device 18 and applies Vcc to the node 14. The output voltage at the terminal 17, if high, turns on the device 19 and applies ground to the node 14. The value provided by the device 18 or 19 to the node 14 remains when the device 12 is disabled so that the cell 10 stays in the condition to which it has been switched by the input signal furnished through the device 12.

However, if the level furnished as the source voltage Vcc is low, then the initial input signal less the Vt drop across the device 12 may be lower than desired at the gates of the devices 15 and 16 so that the selected one of the devices 15 or 16 turns on slowly or not at all. Moreover, the voltage value fed back from the node 17 to operate the devices 18 and 19 may be insufficient to switch the correct one of the devices 18 and 19 to the correct operating state within the time allotted to the operation by the signals controlling the write operation. This is particularly true when switching to the one state. Then, when the device 12 is disabled, the voltage at node 14 and the gates of the devices 15 and 16 will not hold the cell 10 in the correct state. This causes a storage failure.

In order to assure that this condition does not occur, it is typical to provide a test circuit which checks the voltage level provided by the source of power supply voltage to ascertain that it has, in fact, reached a sufficient level so that the cells of the SRAM memory may be written. In prior art circuits, this has been adequate to solve the problem. However, as computers switch to lower power supply voltages in order to conserve energy and to provide longer battery lives for portable devices, the power supply voltage has become more marginal. In many cases, a power supply voltage which is sufficient when tested by such an initial Vcc test circuit later becomes insufficient to provide sufficient levels for switching the SRAM memory cells. This often occurs during the startup period when the power requirements by all of the component circuits are at a maximum level. In such a case, though the initial test circuitry has allowed writing to begin, the power supply voltage has fallen to a point where it is insufficient; and the cells of the SRAM array are incorrectly written. The present invention is adapted to overcome this problem.

Referring now to FIG. 2, there is shown a partially-circuit/partially-block diagram of a circuit in accordance with the present invention. FIG. 3 illustrates the various signals which may be applied to the circuit of FIG. 2 during its operation. The circuit 20 includes a pair of memory cells 21 and 22 each of which includes the same devices as are found in a memory cell 10 of an associated array of memory cells which are to be written with data stored in a non-volatile memory. As may be seen in FIG. 2, these devices include an N type FET device 12(*a* or *b*) through which an input signal level is applied for writing to the cell 21 or 22. The voltage furnished to the cell 21 or 22 less the switching voltage Vt of the device 12(*a* or *b*) is applied at a node 14(*a* or *b*). The node 14(*a* or *b*) joins to the gate terminals of a pair of FET devices 15(*a* or *b*) and 16(*a* or *b*). The device 15(*a* or *b*) is a P type device and has its source terminal joined to a power supply voltage Vcc which may be 5 volts. The drain terminal of the device 15(*a* or *b*) is connected to the drain terminal of the N type FET device 16(*a* or *b*) which has its source terminal joined to ground. The devices 15(*a* and *b*) and 16(*a* and *b*) are designed so that a sufficient high voltage level furnished by the device 12(*a* or *b*) turns on the device 16(*a* or *b*) and applies ground to an output terminal 17(*a* or *b*). A low voltage furnished by the device 12(*a* or *b*) turns on the device 15(*a* or *b*) and applies Vcc to the output terminal 17(*a* or *b*). The value at the output terminal 17(*a* or *b*) is fed back to the gate terminals of a second pair of FET devices 18(a or b) and 19(a or b). The device 18(a or b) is a P type device and has its source terminal joined to the power supply voltage Vcc. The drain terminal of the device 18(a or b) is connected to the drain terminal of the N type FET 19(a or b) which has its source terminal joined to ground.

The cells 21 and 22 function in the same manner as do the memory cells 10 of the associated array. The cells 21 and 22 have components selected to have the same (or statistically slightly worse) characteristics as those of the memory cells 10 of the associated memory array so that the cells may be used to predict the operation of the associated memory cells. Assuming a sufficient power supply voltage Vcc, the output voltage at the terminal 17(a or b), if low, turns on the device 18(a or b) and applies Vcc to the node 14(a or b). The output voltage at the terminal 17(a or b), if high, turns on the device 19(a or b) and applies ground to the node 14(a or b). The value provided by the device 18(a or b) or 19(a or b) to the node 14(a or b) remains when the device 12(a or b) is disabled so that each cell 21 or 22 is held in the condition to which it has been switched by the input signal furnished through the device 12(a or b).

However, if the power supply voltage Vcc is low, then the devices 15(a or b) and 16(a or b) may switch slowly or not at all; and the value fed back from the terminal 17(a or b) to operate the devices 18(a or b) and 19(a or b) may be insufficient to switch the correct one of the devices to the correct operating state within the time allotted to the operation. Thus, when the device 12(a or b) is disabled, the voltage at the gates of the devices 15(a or b) and 16(a or b) will not hold the cell 21 or 22 in the correct state. As with the memory cells 10, this causes a storage failure in the cells 21 or 22.

However, unlike the cells of the associated memory array, the cells 21 and 22 are arranged in a circuit 20 which is adapted to provide an indication at the end of each write operation at any time during the writing of data to the associated memory array that the power supply voltage is insufficient to write a cell. This indication may be utilized in accordance with the present invention to retry the write operation from its beginning in the event of a failure. In this manner, voltage droops which appear after the writing has begun, even though providing a power supply voltage insufficient to correctly write the memory cells 10, are not allowed to cause the associated array to be incorrectly written.

In order to provide this protection, the circuit 20 utilizes input signals generated from a source 23 which provides a constantly alternating value during sequential clock periods. One such source of signals is the least significant bit of a row address used in addressing the associated memory array. Since the row address alternates from high to low with each row selected for writing, such a source will provide a constantly alternating value during sequential clock periods.

The high and low voltage levels provided by the source 23 are applied to an inverter 25. The output of the inverter is applied to a second inverter 26, a third inverter 27, and directly to one input of an exclusive NOR (XNOR) logic circuit 28. The output of the second inverter 26 is applied to a N type FET device 31a. The output of the third inverter 27 is applied to a fourth inverter 29 and to one input of an XNOR logic circuit 30. The output of the fourth inverter 29 is applied to a N type FET device 31b. Thus, the original input signal from the source 23 is applied to the device 31a and to the XNOR logic circuit 30 while an inverted input signal from the source 23 is applied to the device 31b and to the XNOR logic circuit 28.

The voltage levels transferred by each of the devices 31a and 31b are furnished to the devices 12a and 12b, respectively. Since device 31a or b is an N type device, a high valued input will drop Vt across its drain and source. As a result, the voltage drop across device 12 is minimal. A very large N type device 33a or 33b is connected between ground and the input to the devices 12a and 12b, respectively. The devices 33(a and b) are chosen to provide a capacitance equivalent to that of the memory cells of the associated array when a particular bitline is selected for writing. Consequently, the capacitive load at the input to each of the cells 21 and 22 is essentially identical to that which a signal at the input to an actual memory cell 10 in an associated memory array experiences. As with the cell values, the capacitive load may be increased to lengthen slightly the time required to write the cells 21 and 22 so that these cells fall slightly before the cells of the associated memory array.

Signals for enabling each of the transistor devices 31(a and b) and 12(a and b) are provided by the control signals used with the associated memory array for enabling particularly write paths. For example, a signal SWREN which controls the transfer of data to particular bitlines in the associated memory array is furnished to the gate terminal of the devices 31(a and b) by inverters 34 and 35. A signal PUPSWR which is a write control signal in the associated memory array is furnished to the gate terminal of the devices 12(a and b) by inverters 37 and 38. Thus when a particular memory cell 10 is to be written, data indicating a state to be written to each of the cells 21 and 22 is transferred through the devices 31(a and b) and 12(a and b) from the source 23. At the same time, the same data indicating a state to be written is transferred to one input of the XNOR circuit 28 or 30 associated with the output of the particular memory cell 21 or 22.

If a high valued input is furnished by the device 12a and at the node 14a, this voltage turns on the device 16a and applies ground to the output terminal 17a. The low voltage at the output terminal 17a is fed back to the gate terminals of the FET devices 18a and 19a. If the power supply voltage is sufficient, the low voltage turns on the device 18a and applies Vcc to the gates of the devices 15a and 16a to assure that the cell 21 remains in the condition when the device 12a is disabled at which ground is provided at the terminal 17a.

On the other hand, a low voltage furnished by the device 12a turns on the device 15a and applies Vcc to the output terminal 17a. The high voltage at the output terminal 17a is fed back to the gate terminals of the FET devices 18a and 19a. If the power supply voltage is sufficient, the high voltage turns on the device 19a and applies ground to the gates of the devices 15a and 16a to assure that the cell 21 remains in the condition when the device 12a is disabled at which Vcc is provided at the terminal 17a.

The signal at the output terminal 17a is inverted by a inverter 39 and transferred to another input to the XNOR circuit 30. If a high voltage is provided by the source 23, a high voltage is provided to the XNOR circuit 30; while if a low voltage is provided by the source 23, a low voltage is provided to the XNOR circuit 30. It will be seen that in either case, the voltage provided from the cell 21 to the XNOR circuit 30 is the same (if the power supply voltage is sufficient to write to the cell) as the voltage provided at the other input to the XNOR circuit 30. Thus, if there is sufficient power supply voltage for the cell 21 to function, the two input signals to the XNOR circuit 30 are identical. This causes the XNOR circuit 30 to provide a one valued output signal to a NAND gate 41.

On the other hand, if the power supply voltage Vcc is insufficient to switch the memory cell 21 with either a high or a low value, then the devices 15(*a* or *b*) and 16(*a* or *b*) switch slowly; and the signal applied at the output terminal 17*a* and fed back to the gate terminals of the devices 18*a* and 19*a* is insufficient to latch the cell 21 into the proper state. Instead, once the device 12*a* is disabled, the output at the terminal 17*a* which is inverted and transferred to the input to the XNOR logic circuit 30 is opposite in value to the signal provided on the other input terminal to that XNOR gate 30. This causes the XNOR gate 30 to furnish a zero valued signal to the NAND gate 41.

While a high valued signal is being provided to the cell 21 from the source 23, a low valued signal is being provided to the memory cell 22 and to one input to the XNOR logic circuit 28. If the value of Vcc is sufficient for writing, then the value furnished at the other input to the XNOR logic circuit 28 by the cell 22 is also low. This causes the XNOR logic circuit 28 to furnish a one signal to the NAND gate 41. If a low valued signal is being provided to the cell 21, a high valued signal is being provided to the memory cell 22 and to one input to the XNOR logic circuit 28. A high valued input to the cell 22 at the node 14*b* from the source 23 generates a high valued input to both of the input terminals of the XNOR circuit 28 when the level of Vcc is sufficient and causes the XNOR circuit 30 to provide a one valued output signal to the NAND gate 41. However, if the power supply voltage Vcc is insufficient to switch the memory cell 22 with either a high or a low value, then the signal applied at the output terminal 17*b* and inverted and transferred to the input to the XNOR logic circuit 28 is opposite in value to the signal provided on the other input terminal to that XNOR gate 28. This cause the XNOR gate 28 to furnish a zero valued signal to the NAND gate 41.

It should be noted that each cell 21 and 22 is being tested by the circuit of the present invention whenever an input signal is being received. Since the cells 21 and 22 are being written in opposite senses, the direction in which switching is taking place in the associated memory cell being written will have no effect. A failure of either cell 21 or 22 will cause the NAND gate 41 to generate a high value fail output signal to cause the data written to the associated memory array to be ignored and the write operation to recommence. Moreover, it is always more difficult to switch a memory cell to an opposite state than it is to cause it to stay in the same state. Consequently, the provision of a pair of cells causes the worst condition always to be tested since each cell 21 and 22 is always switched to a condition opposite that to which it is presently in. With each input signal, the ability to write both a one and a zero is tested by the circuit of the present invention.

As may be seen, the fail signal generated by the NAND gate 41 is transferred to a state machine which controls writing to the associated memory array to ignore the data already written and re-initiate a new write from the non-volatile memory to the associated memory array.

Referring now to FIG. 4, there is illustrated a computer system 50. The system 50 includes a central processing unit 51 which carries out the various instructions provided to the computer system 50 for its operations. The central processing unit 51 is joined to a bus 52 adapted to carry information to various components of the system 50. Joined to the bus 52 is main memory 53 which is typically constructed of dynamic random access memory arranged in a manner well known to those skilled in the prior art to store information during the period in which power is provided to the system 50. Also joined to the bus 52 is read only memory 54 which may include various memory devices (such as electrically programmable read only memory devices (EPROM devices)) well known to those skilled in the art which are adapted to retain a memory condition in the absence of power to the system 50. The read only memory 54 typically stores various basic functions used by the central processing unit 51 such as basic input output processes and startup processes.

Also connected to the bus 52 are various peripheral components such as long term memory 56. The construction and operation of long term memory 56 (typically electro-mechanical hard disk drives) is well known to those skilled in the art. Also joined to the bus 52 is circuitry such as a frame buffer 57 to which data may be written which is to be transferred to an output device such as a monitor 58 for display. A bus master 59 is shown joined to the bus 52. A bus master typically includes its own local processor and is able to control operations on a bus. FIG. 4 also illustrates a circuit 60 which may be joined to the bus 52. A circuit 60 may be a programmable logic circuit (such as a programmable logic array, a programmable array logic circuit, or a programmable logic device) constructed in a manner well known to those skilled in the art which is used to provide the logic circuitry by which various ones of the component circuits may be associated through the bus 52 with the system. Such circuitry is often referred to as glue logic.

The circuit of FIG. 2, described above, may be utilized in such a system as that shown in FIG. 4 in accordance with the teachings of the present invention. Such a circuit 20 may be used, for example, to provide storage capabilities in any of a number of components used in the system of FIG. 4. For example, any bus master component which includes a processor or controller may have associated therewith SRAM memory which may be utilized to furnish instructions for its local processor. Such a memory array is utilized, for example, with certain flash EEPROM memory arrays. A SRAM memory of this sort might also be associated with a central processing unit 51 or other component of the system to provide particular instructions for use by a processor used for specialized purposes.

The programmable logic circuit 60 may be designed to utilize a preferred embodiment of the present invention. For example, the logic functions of the programmable logic circuit may be programmed by setting the states of various SRAM devices. The states to which the SRAM devices are written each time the computer system is turned on may be stored in a non-volatile memory which is a part of the same integrated circuit as the SRAM devices and the other elements of the programmable logic circuit.

Although the present invention has been described in terms of a preferred embodiment, it will be appreciated that various modifications and alterations might be made by those skilled in the art without departing from the spirit and scope of the invention. For example, the present invention might be utilized for writing or programming other types of memory circuitry than SRAM arrays where the power supply voltage level is critical. Moreover, any non-volatile array might be provided with an extra set of bitlines with cells adapted to store alternate zero and one states in accordance with the description furnished herein; the output conditions of the memory cells on those bitlines might be tested with XNOR and NAND circuitry against alternating row address bits in accordance with the present invention to test the sufficiency of the voltage source used in reading the associated non-volatile arrays. The invention should therefore be measured in terms of the claims which follow.

What is claimed is:

1. A random access memory (RAM) testing apparatus that tests validity of data written to a RAM, said RAM testing apparatus comprising:

a pair of memory cells that stimulates an array cell of said RAM, said pair of memory cells being separate from said array cell, each of said memory cells in the pair being functionally similar to said array cell;

capacitive loading circuitry coupled to said pair of memory cells that provides a first capacitive lead to each of said pair of memory cells, said first capacitive lead being at least as great as a second capacitive lead to said array cell;

input circuitry coupled to said pair of memory cells that applies a first input signal to a first of said memory cells in said pair and for providing a second input signal to a second of said memory cells in said pair, said first input signal being logically inverse to said second input signal, said input circuitry operating during a write operation of said RAM;

comparing circuitry coupled to said pair of memory cells that compares values stored in each of said pair of memory cells after application of said first and said second input signals to said first and said second input signals to determine if each of said memory cells has stored a correct value; and fail signal circuitry coupled to said comparing circuitry that generates a fail signal if said comparing circuitry indicates that either one of said pair of memory cells has not stored said correct value.

2. The RAM testing apparatus of claim 1 wherein said RAM is a static RAM (SRAM).

3. The RAM testing apparatus of claim 1 wherein said fail signal further causes said write operation to be restarted.

4. The RAM testing apparatus of claim 1 wherein said first capacitive load is adjusted to be greater than said second capacitive load, said adjustment causing said fail signal to be generated at a higher voltage level of said input signals to each of said pair of memory cells than a voltage level at which said fail signal would have been generated before said adjustment.

5. A test circuit for determining a storing status of a pair of memory cells, each functionally similar to but separate from an array cell of a memory array said test circuit comprising:

(A) a capacitive loading circuit providing a first capacitive lead to each cell of said pair of memory cells, said capacitive leading circuit coupled to said pair of memory cells, (B) an input circuit providing a first input signal to a first memory cell of said pair and providing a second input signal to a second memory cell of said pair, said first input signal being logically inverse to said second input signal, each of said memory cells in said pair attempting to store said first or said second input signal which it receives, said input circuit operating during a write operation of said memory array, said input circuit coupled to said pair of memory cells, and (C) a determining circuit coupled to said input circuit determining whether either of said memory cells in said pair has failed to store said first or said second input signal which it received said determining circuit having
(1) a comparing circuit comparing signals stored in each of said first and said second memory cells to said first or said second input signal each of said memory cells received, said comparing circuit coupled to said pair of memory cells and to said input circuit, and
(2) a fail signal circuit coupled to said comparing circuit generating a fail signal if either of said pair of memory cells has stored a signal different from said first or said second signal which it received, said fail signal circuit coupled to said comparing circuit.

6. The test circuit of claim 5 wherein said pair of memory cells and said cells of said memory array are static random access memory (SRAM) cells.

7. The test circuit of claim 5 wherein said pair of memory cells and said cells of said memory array are erasable programmable read only memory (EPROM) cells.

8. The test circuit of claim 5 wherein said capacitive loading circuit provides said first capacitive load to each of said pair of memory cells which is greater than a second capacitive load to said array cell, such that a voltage level of said first and said second input signals at which said fail signal is generated is higher than that at which said fail signal would be generated if said first capacitive load was equal to said second capacitive load.

9. The test circuit of claim 5 wherein said fail signal circuit further causes said write operation to be restarted.

10. A system comprising: a voltage source;

a memory device, said voltage source being external to said memory device and supplying voltage to said memory device, said memory device having;

a non-volatile memory for storing data;

a volatile memory for storing data;

a circuit writing data stored in said non-volatile memory to said volatile memory;

first and second memory cells, each functionally similar to, but separate from, an array cell of said volatile memory;

a capacitive loading circuit providing a first capacitive load to said first and said second memory cells, said capacitive loading circuit coupled to said first and said second memory cells;

an input circuit providing a first input signal to said first memory cell and a second input signal to said second memory cell, said first input signal being logically inverse to said second input signal, said first and said second memory cells attempting to store said first and said first and said second input signals, respectively, said input circuit operating during a write operation of said volatile memory array cell, said input circuit coupled to said first and said second memory cells; and a determining circuit determining whether either of said first or said second memory cells has failed to store a correct value, said determining circuit coupled to said input circuit and to said first and said second memory cells.

11. The system of claim 10 wherein said determining circuit further comprises:

a comparing circuit comparing signals stored in each of said first and said second memory cells to said first or said second input signal; and a fail signal circuit generating a fail signal if either of said first or said second memory cells has not stored said correct value, said fail signal circuit coupled to said comparing circuit.

12. The system of claim 11 wherein said first and said second memory cells and said memory cells of said volatile memory are static random access memory (SRAM) cells.

13. The system of claim 11 wherein said non-volatile memory cells are erasable programmable read only memory (EPROM) cells.

14. The system of claim 11 wherein said fail signal circuit further causes said write operation of said volatile memory to be restarted.

15. The system of claim 10 wherein said capacitive loading circuit provides said first capacitive load to said first and said second memory cells which is greater than a second capacitive load to said memory cells of said volatile memory, such that a voltage level of said first and said second input signals at which said fail signal is generated is higher than that at which said fail signal would be generated if said first and said second capacitive loads were the same.

16. In a computer system comprising a processor, an output device and a memory array, a method of determining whether power supply voltage is sufficient to write valid data to said memory array, said method comprising the steps of:

providing a first capacitive load to two memory cells, said two memory cells being separate memory cells from said memory array, but similar in function to array cells of said memory array;

attempting to store a logic value in a first of said separate memory cells and attempting to store an inverse logic value in a second of said separate memory cells, said step of attempting to store being executed during a write operation of said memory array;

comparing values actually stored in said separate memory cells with said values attempted to be stored in said storing step; and generating a fault signal if said values actually stored and said values attempted to be stored are not equal.

17. The method of claim 16 wherein said memory array is a static random access memory (SRAM) array.

18. The method of claim 16 wherein said memory array is an erasable programmable read only memory (EPROM) array.

19. The method of claim 16 wherein said step of providing said first capacitive load to two memory cells further comprises the step of adjusting said first capacitive load to be greater than a second capacitive load to said memory array, such that a level of said power voltage at which said fault signal is generated is greater than that at which said fault signal would be generated if said first capacitive load was the same as said second capacitive load.

20. The method of claim 16 wherein said step of generating a fault signal further comprises the step of causing said write operation to be restarted.

* * * * *

UNITED STATES PATENT AND TRADEMARK OFFICE
CERTIFICATE OF CORRECTION

PATENT NO.     : 5,533,196
DATED          : July 2, 1996
INVENTOR(S)    : Joseph H. Salmon It is certified that error appears in the above-identified patent and that said Letters Patent is hereby corrected as shown below:

In column 9 at line 6 delete "lead" and insert --load--

In column 9 at line 8 delete both occurrences of "lead" and insert --load--

In column 9 at line 43 delete "lead" and insert --load--

In column 9 at line 44 delete "leading" and insert --loading--

Signed and Sealed this

Eleventh Day of February, 1997

Attest:

BRUCE LEHMAN

*Attesting Officer*            *Commissioner of Patents and Trademarks*